United States Patent
Baldwin et al.

(10) Patent No.: US 6,373,343 B1
(45) Date of Patent: Apr. 16, 2002

(54) OSCILLATOR AND METHOD

(75) Inventors: David J. Baldwin, Allen; Christopher M. Cooper, Denison; Joseph A. Devore, Richardson; Ross E. Teggatz, McKinney, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 32 days.

(21) Appl. No.: 09/649,367

(22) Filed: Aug. 28, 2000

Related U.S. Application Data

(60) Provisional application No. 60/152,478, filed on Sep. 3, 1999.

(51) Int. Cl.[7] .................................................. H03B 5/24

(52) U.S. Cl. .............................. 331/76; 331/60; 331/74; 331/111; 331/143

(58) Field of Search ............................ 331/60, 61, 74, 331/76, 111, 143; 327/116, 184, 291, 293–295, 299

(56) References Cited

U.S. PATENT DOCUMENTS 3,842,371 A * 10/1974 Kelley ........................ 331/143

* cited by examiner

*Primary Examiner*—David Mis
(74) *Attorney, Agent, or Firm*—William B. Kempler; Mark E. Courtney; Frederick J. Telecky, Jr.

(57) ABSTRACT

An integrated circuit (10) is disclosed comprising a fundamental frequency oscillator comprising a reference node (32) whose voltage varies between a high threshold and a low threshold. The fundamental frequency oscillator is operable to generate a first output at the fundamental frequency on a first output node (36). The integrated circuit (10) also comprises a circuit (C2) coupled to the reference node. The circuit (C2) is operable to sense the voltage at the reference node (32), to determine when the voltage exceeds an intermediate threshold between the high threshold and the low threshold, and to generate a second output in response to the determination. The integrated circuit (10) also comprises logic (40) coupled to the circuit (C2) and load circuitry (50) coupled to the logic (40). The logic (40) is operable to generate an output signal at an output frequency greater than the fundamental frequency in response to the second output and the first output.

20 Claims, 1 Drawing Sheet

OSCILLATOR AND METHOD

This application claims priority under 35 USC §119(e)(1) of provisional application No. 60/152,478 filed Sep. 3, 1999.

TECHNICAL FIELD OF THE INVENTION

This invention relates generally to the field of integrated circuits and more particularly to an oscillator and method.

BACKGROUND OF THE INVENTION

Integrated circuits often employ an oscillator, or clock source, which generates a fundamental frequency. In many cases, it is desirable for the clock source to be internally-generated and contain no external parts, such as resonators, crystals, or capacitors. Typically, in such circuits, reduction of circuit complexity and circuit area is desirable. Changes in design or manufacturing requirements may impose changes to the frequency desired for the oscillator. For example, a subsequent generation of an integrated circuit may operate at a higher speed. Such changes present challenges to traditional oscillator designs, which have typically been addressed by changing the design of the oscillator or with the use of phase-locked loop (PLL) technology, both of which introduce additional design cost and may extend development time. Therefore, an oscillator that can be easily adapted to generate multiples of the original fundamental frequency is needed.

SUMMARY OF THE INVENTION

One aspect of the invention is an integrated circuit comprising a fundamental frequency oscillator comprising a reference node whose voltage varies between a high threshold and a low threshold. The fundamental frequency oscillator is operable to generate a first output at the fundamental frequency on a first output node. The integrated circuit also comprises a circuit coupled to the reference node. The circuit is operable to sense the voltage at the reference node, to determine when the voltage exceeds an intermediate threshold between the high threshold and the low threshold, and to generate a second output in response to the determination. The integrated circuit also comprises logic coupled to the circuit and load circuitry coupled to the logic. The logic is operable to generate an output signal at an output frequency greater than the fundamental frequency in response to the second output. and the first output.

The invention provides several important advantages. Various embodiments of the invention may have none, some, or all of these advantages. It allows a higher frequency to be generated with few modifications to an existing oscillator design. The invention may reduce design time, and cost of the design. It also allows the use of existing oscillator designs or other circuitry, such as frequency trimming circuitry. Some embodiments of the invention may be used to generate an integer multiple of the original fundamental frequency of the oscillator. Rather than employing higher bandwidth analog devices (such as comparators) to achieve a higher frequency output, the invention allows generation of higher frequency output using the same devices employed in an existing oscillator design with a fundamental frequency below the higher frequency. This advantage may further reduce design time and cost as well as potentially lowering power consumption. It may achieve these advantages while using relatively little additional integrated circuit area and current drain compared to the existing oscillator design used to generate a higher frequency in accordance with the invention. It also may allow generation of multiple frequencies that can all be used simultaneously in an integrated circuit, without requiring multiple oscillators.

BRIEF DESCRIPTION OF THE DRAWINGS

For a more complete understanding of the present invention and the advantages thereof, reference is now made to the following descriptions taken in connection with accompanying drawings in which.

DETAILED DESCRIPTION OF THE INVENTION

Figure 1:
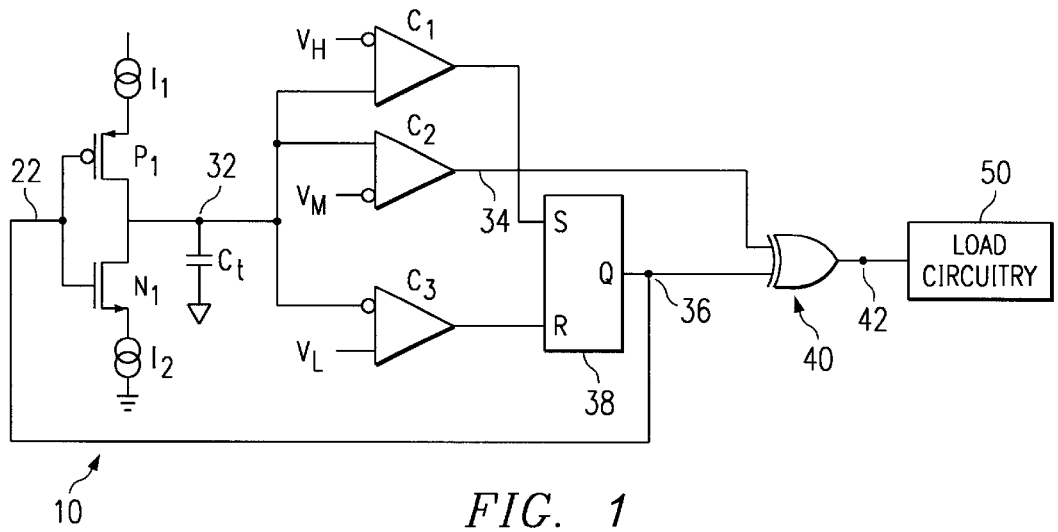
FIG. 1 illustrates a schematic diagram of one embodiment of an integrated circuit utilizing the teachings of the present invention.
Figure 2:
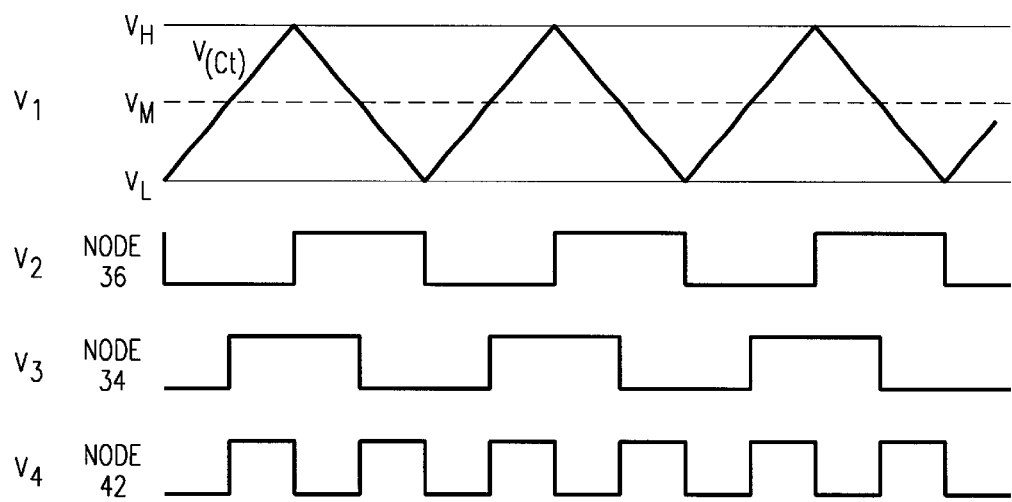
FIG. 2 illustrates a series of waveforms demonstrating the operation of the present invention.

The present invention and its advantages are best understood by referring to FIGS. 1 and 2 of the drawings, like numerals being used for like and corresponding parts of the drawings.

FIG. 1 illustrates a schematic diagram of one embodiment of an integrated circuit utilizing the teachings of the present invention. Integrated circuit 10 comprises a fundamental frequency or base oscillator, a circuit C2, and logic 40. Logic 40 may be coupled to suitable load circuitry 50 at output node 42. Although direct connections are illustrated for various elements, many elements may be coupled through other elements without departing from the scope of the invention. As further detailed below, a circuit (such as C2) and logic (such as 40) may be coupled to a base oscillator having a base or fundamental frequency of oscillation $F_0$ to obtain an oscillator having one or more output frequencies that are multiples of the fundamental frequency $F_0$.

In this example, the base oscillator comprises a capacitor charge-discharge oscillator. It comprises switch P1 and switch N1, which are coupled to current sources I1 and I2, respectively. Switches P1 and N1 couple input node 22 to reference node 32. The base oscillator also comprises comparators C1 and C3 and S/R flip-flop 38. Comparators C1 and C3 couple reference node 32 to S/R flip-flop 38, and are each operable to determine when the voltage at reference node 32 exceeds its respective threshold $V_H$ or $V_L$. Output node 36 of S/R flip-flop 38 is coupled to input node 22 and to logic 40.

Reference node 32 is capacitively coupled to ground through capacitor $C_T$ which also comprises a part of the base oscillator. Although a capacitor charge-discharge oscillator is used in this example, other base oscillators may also be used in integrated circuit 10 without departing from the scope of the invention. Any base oscillator that uses the magnitude of a voltage on a reference node to determine a fundamental frequency (such as by using comparators) may be used without departing from the scope of the invention.

In operation, the base oscillator has a fundamental frequency $F_0$ that is controlled by comparators C1 and C3. First, a charge current I1 is supplied via switch P1 to charge capacitor $C_T$. Comparators C1 and C3 generally sense the voltage at reference node 32 as capacitor $C_T$ charges or discharges, against reference voltage thresholds $V_H$ and $V_L$, respectively. As a voltage across capacitor $C_T$ at reference node 32 exceeds upper threshold $V_H$, output node. 36 is set to a logic high by comparator C1. This logic high is fed back to input 22 of the oscillator, switching off charge current I1 through switch P1.

Simultaneously, discharge current I2 is then enabled through switch N1. This discharge current removes charge from capacitor $C_T$, reducing capacitor $C_T$'s voltage at reference node 32. When the voltage across capacitor $C_T$ drops to a lower threshold $V_L$, output node 36 is reset to a logic low by comparator C3. This logic low is fed back to input 22, disabling discharge current I2 and simultaneously enabling charge current I1 through switch P1, thus repeating the cycle.

The fundamental frequency $F_0$ is typically related to the charge or discharge currents I1 or I2, voltage thresholds $V_H$ and $V_L$, and capacitor $C_T$ as:

$$F_0 = \frac{I1}{2C_T(V_H - V_L)}$$

The base oscillator may typically be designed to achieve a desired fundamental frequency $F_0$.

Circuit C2 and logic 40 may be coupled to the base oscillator to form system 10 whose frequency output is different from the fundamental frequency $F_0$. For example, circuit C2 may comprise circuitry (such as one or more comparators) operable to determine when the voltage at reference node 32 exceeds one or more thresholds between $V_H$ and $V_L$. Logic 40 may comprise suitable circuitry that decodes the one or more circuit and base oscillator outputs, and generates one or more frequencies at output node 42. To illustrate, frequency $F_0$ may be doubled by coupling one comparator to suitable logic. Frequency $F_0$ may also be tripled, quadrupled and so on by coupling additional circuitry such as comparators sensing various voltage levels at reference node 32 to suitable logic 40. Logic 40 may also comprise divisional logic suitable to generate fractional or non-integer frequency multiples of $F_0$ at output node 42. For example, a frequency $5F_0$ could be divided by two to produce $2.5F_0$. Furthermore, logic 40 may comprise circuitry that generates multiple frequency outputs at node 42. This may desirably reduce design time and cost by providing simultaneous availability of multiple frequencies in an integrated circuit using one base oscillator.

In this embodiment, circuit C2 comprises a comparator, which couples reference node 32 to logic 40. Comparator C2 is operable to determine when the voltage at reference node 32 exceeds a threshold $V_M$ that is between $V_H$ and $V_L$. Comparator C2 generally monitors the voltage at reference node 32 against a reference voltage threshold $V_M$, a predetermined value between $V_H$ and $V_L$. Because reference voltage threshold $V_M$ falls between $V_H$ and $V_L$, output 34 of comparator C2 will be asserted high between each of the asserted highs of comparators C1 and C3. Specifically, output 34 will remain asserted high while the voltage at reference node 32 remains above reference voltage threshold $V_M$. These waveforms and their relationships are illustrated and discussed in further detail in conjunction with FIG. 2.

Logic 40 receives the signals from outputs 34 and 36. In this embodiment, logic 40 comprises exclusive—or logic that operates to form a waveform with frequency $F_1$ at output node 42 equal to $2 \times F_0$. Thus, frequency $F_1$ as illustrated in FIG. 2 is twice the frequency $F_0$ measured at reference node 32 generated by the oscillator.

Logic 40 may comprise any suitable logic operable to process inputs from outputs 34 and 36. Logic 40 may also drive any suitable load circuitry 50 coupled to output node 42, whether digital or analog. Multiple logic circuits could be used to derive multiple outputs each having a different frequency that is a multiple of the oscillator fundamental frequency. It is also within the scope of the invention to utilize logic (such as dividers) to achieve frequencies that are fractional, or less than an integer multiple of the fundamental frequency. One such example includes coupling divisional logic to output node 42.

FIG. 2 illustrates a series of waveforms demonstrating the operation of the present invention. Waveforms V1–V4 are measurable at nodes 32, 36, 34, and 42, respectively, as described in detail in conjunction with FIG. 1.

Waveform V1 illustrates the voltage level measurable on reference node 32 as capacitor $C_T$ charges and discharges. In the embodiment of FIG. 1, waveform V1 illustrates a typical output for a capacitor charge-discharge voltage ramp oscillator, between predetermined voltage thresholds $V_H$ and $V_L$.

Waveforms V2–V4 illustrate logic high and low levels at nodes 36, 34, and 42, respectively. As discussed in conjunction with FIG. 1, the logic levels at node 36 follow the outputs of comparators C1 and C3. Thus, as the voltage at reference node 32 exceeds each reference threshold voltage $V_H$ and $V_L$, SIR flip-flop 38 is set and reset, respectively. S/R flip-flop 38 outputs waveform V2, a square wave with fundamental frequency $F_0$.

Waveform V3 illustrates the output of comparator C2, which exceeds and remains at an asserted high as long as the voltage at reference node 32 remains above reference threshold voltage $V_M$. Waveform V3 drops accordingly as reference node 32's voltage drops below $V_M$. In this embodiment, $V_M$ is located generally at a midpoint between $V_L$ and $V_H$, resulting in a waveform symmetrically-shaped about thresholds $V_L$ and $V_H$.

It is within the scope of the invention for $V_M$ to be located at any point between $V_H$ and $V_L$ in order to create different duty cycles for or other desirably-shaped waveforms V3 and V4. Further, waveform V3 may comprise other frequencies. For example, multiple comparators with respective thresholds VM1, VM2, . . . , VMN may be located between $V_L$ and $V_H$, and may be coupled to suitable logic. In one embodiment, each additional threshold may be coupled to a comparator and suitable logic to generate an output signal comprising a subsequent integer multiple of frequency $F_0$ at output node 42. Multiple output signals comprising identical or different frequencies may also be generated. Such thresholds may also be dynamically determined.

As can be seen from FIG. 2 in this embodiment, waveform V4 comprises a square wave with frequency $F_1$, which is twice the fundamental frequency $F_0$ of waveform V2. Waveform V4 reflects an exclusive—or of the logic signals on nodes 34 and 36, waveforms V3 and V2 respectively. Thus, any suitable load circuitry 50 coupled to node 42 may receive frequency $F_1$ rather than the frequency $F_0$ originally generated by the oscillator. Waveform V4 may also be any shape and frequency and have any duty cycle without departing from the scope of the invention.

While the invention has been particularly shown and described by the foregoing detailed description, it will be understood by those skilled in the art that various other changes in form and detail may be made without departing from the spirit and scope of the invention.

What is claimed is:

1. An oscillator, comprising:
   a fundamental frequency oscillator comprising a reference node whose voltage varies between a high threshold and a low threshold and operable to generate a first output at the fundamental frequency on a first output node;
   a circuit coupled to the reference node, the circuit operable to sense the voltage at the reference node, to determine whether the voltage at the reference node exceeds an intermediate threshold between the high threshold and the low threshold, and to generate a second output in response to the determination; and logic coupled to the circuit and to the fundamental frequency oscillator, the logic operable to generate a third output having a frequency greater than the fundamental frequency in response to the first output and the second output.

2. The oscillator of claim 1, wherein the second output has a different duty cycle than the first output.

3. The oscillator of claim 2, wherein the oscillator comprises a capacitor charge-discharge oscillator.

4. The oscillator of claim 1, wherein the third output has a frequency comprising an integer multiple of the fundamental frequency.

5. The oscillator of claim 1, wherein the circuit comprises a first comparator operable to determine when the voltage exceeds the intermediate threshold.

6. The oscillator of claim 1, wherein:

the circuit comprises a plurality of comparators and is operable to determine whether the voltage at the reference node exceeds a plurality of thresholds between the high threshold and the low threshold and to generate one or more additional outputs in response to this determination; and the logic is operable to generate the third output in response to the first output, the second output, and the one or more additional outputs.

7. The oscillator of claim 1, wherein the intermediate threshold is predetermined.

8. An integrated circuit, comprising:

a fundamental frequency oscillator comprising a reference node whose voltage varies between a high threshold and a low threshold and operable to generate a first output at the fundamental frequency on a first output node;

a circuit coupled to the reference node, the circuit operable to sense the voltage at the reference node, to determine whether the voltage at the reference node exceeds an intermediate threshold between the high threshold and the low threshold, and to generate a second output in response to the determination;

logic coupled to the circuit and to the fundamental frequency oscillator, the logic operable to generate a third output having a frequency greater than the fundamental frequency in response to the second output and the first output; and load circuitry coupled to the logic.

9. The integrated circuit of claim 8, wherein the oscillator comprises a capacitor charge-discharge oscillator.

10. The integrated circuit of claim 8, wherein the third output has a frequency comprising an integer multiple of the fundamental frequency.

11. The integrated circuit of claim 8, wherein the circuit comprises a first comparator operable to determine when the voltage exceeds the intermediate threshold.

12. The integrated circuit of claim 8, wherein:

the circuit comprises a plurality of comparators and is operable to determine whether the voltage at the reference node exceeds a plurality of thresholds between the high threshold and the low threshold and to generate one or more additional outputs in response to this determination; and the logic is operable to generate the third output in response to the first output, the second output, and the one or more additional outputs.

13. The integrated circuit of claim 8, wherein the voltage between the high voltage and the low voltage is predetermined.

14. A method of generating a frequency output, comprising:

generating a first output at a fundamental frequency on a first output node of a fundamental frequency oscillator, the fundamental frequency oscillator comprising a reference node whose voltage varies between a high threshold and a low threshold;

detecting when the voltage on the reference node exceeds an intermediate threshold between the high threshold and the low threshold;

generating a second output in response to the detection; and using logic circuitry to generate a third output having a frequency greater than the fundamental frequency in response to the first and the second outputs.

15. The method of claim 14, wherein the oscillator comprises a charge-discharge oscillator.

16. The method of claim 14, wherein the third output has a frequency comprising an integer multiple of the fundamental frequency.

17. The method of claim 14, wherein the detecting step is performed using a comparator operable to detect when the voltage on the node exceeds the intermediate threshold.

18. The method of claim 14, wherein the second output has a different duty cycle than the first output.

19. The method of claim 14, wherein the voltage between the high voltage and the low voltage is predetermined.

20. The method of claim 14, wherein:

the circuit comprises a plurality of comparators and is operable to determine whether the voltage at the reference node exceeds a plurality of thresholds between the high threshold and the low threshold and to generate one or more additional outputs in response to this determination; and the logic is operable to generate the third output in response to the first output, the second output, and the one or more additional outputs.

* * * * *